United States Patent [19]
Takahashi et al.

[11] Patent Number: 5,470,770
[45] Date of Patent: Nov. 28, 1995

[54] MANUFACTURING METHOD OF SEMICONDUCTOR DEVICE

[75] Inventors: Shigeki Takahashi, Okazaki; Mitsuhiro Kataoka, Kariya; Tsuyoshi Yamamoto, Chiryu, all of Japan

[73] Assignee: Nippondenso Co., Ltd., Kariya, Japan

[21] Appl. No.: 413,404

[22] Filed: Mar. 30, 1995

[30] Foreign Application Priority Data

Mar. 31, 1994 [JP] Japan .................................... 6-062447

[51] Int. Cl.$^6$ .............................................. H01L 21/8234
[52] U.S. Cl. ................... 437/41; 437/29; 437/72; 437/913; 148/DIG. 126
[58] Field of Search .................... 437/41, 67, 68, 437/69, 72, 913, 29; 148/DIG. 126

[56] References Cited

U.S. PATENT DOCUMENTS

| | | | |
|---|---|---|---|
| 4,965,221 | 10/1990 | Dennison et al. | 437/69 |
| 5,371,024 | 12/1994 | Hieda et al. | 437/913 |
| 5,399,520 | 3/1995 | Jang | 437/72 |

FOREIGN PATENT DOCUMENTS

| | | | |
|---|---|---|---|
| 3427293 | 2/1985 | Germany . | |
| 56-96865 | 8/1981 | Japan . | |
| 0147042 | 9/1983 | Japan | 437/72 |
| 60-28271 | 2/1985 | Japan . | |
| 62-12167 | 1/1987 | Japan . | |
| 62-46569 | 2/1987 | Japan . | |
| 63-250852 | 10/1988 | Japan . | |
| 63-266882 | 11/1988 | Japan . | |
| 286136 | 3/1990 | Japan . | |
| 2100370 | 4/1990 | Japan . | |
| 9303502 | 2/1993 | WIPO . | |

OTHER PUBLICATIONS

Norihito Tokura et al "The DMOS Consisting of Channel Region Defined by LOCOS (LOCOS–DMOS): . . . MOS-FET" IEEE 5th International Symposium on Power Semiconductor Devices and ICs, May 18–20, 1993 pp. 135–140.

Nikkei Electronics 1986 5.19 (No. 395), pp. 165–188.

*Primary Examiner*—Brian E. Hearn
*Assistant Examiner*—Michael Trinh
*Attorney, Agent, or Firm*—Cushman, Darby & Cushman

[57] ABSTRACT

A manufacturing method for a semiconductor device, which can attain a low ion voltage in a manufacturing method for a semiconductor device involving a process for forming a groove by etching prior to selective oxidation, selectively oxidizing a region including the groove and thereby making a channel part of the groove, is disclosed. A groove part is thermally oxidized by using a silicon nitride film as a mask. A LOCOS oxide film is formed by this thermal oxidation, and concurrently a U-groove is formed on the surface of an $n^-$-type epitaxial layer eroded by the LOCOS oxide film, and the shape of the U-groove is fixed. A curve part formed during a chemical dry etching process remains as a curve part on the side surface of the U-groove. Then, an $n^+$-type source layer is formed by means of thermal diffusion to a junction thickness of 0.5 to 1 μm, and a channel is set up as well. The junction depth obtained by this thermal diffusion is set up more deeply than the curve part which is formed during the above etching and remains on the side surface of the U-groove after the above selective thermal oxidation.

7 Claims, 16 Drawing Sheets

[011]

CF₄+O₂

13.56MHz

MANUFACTURING METHOD OF SEMICONDUCTOR DEVICE

CROSS REFERENCE TO RELATED APPLICATION

This application is based upon and claims the benefit of priority of the prior Japanese Patent application No. 6-62447 filed on Mar. 31, 1994, the contents of which are incorporated herein by reference.

BACKGROUND OF THE INVENTION

1. Field of the Invention

The present invention generally relates to a manufacturing method for a semiconductor device. More particularly, the present invention relates to a manufacturing method for a semiconductor device used as a power semiconductor device and can suitably be employed for, for example, a vertical type MOSFET (metal oxide semiconductor field effect transistor), an IGBT (insulated gate bipolar transistor) or a MOSIC as a single unit or with the incorporation of a power semiconductor device.

2. Related Arts

Recently, a vertical type power MOSFET has been used in many industrial fields for various features thereof such as high frequency characteristics, fast switching speed and low power driving. The Nikkei Electronics (Nikkei-McGraw-Hills, Inc., May 19, 1986, pp. 165–188) says that the focus of the development of the power MOSFET has shifted to the low withstand voltage type and the high withstand voltage type, and that the ON-resistance of the power MOSFET having a withstand voltage of 100 V or less has been lowered down to a level of 10 mΩ for the reason that channel width per unit area has been widened by using the microprocessing of LSI for the manufacture of the power MOSFET or by improving the shape of the power MOSFET. The description of this magazine centers around the prevailing vertical type power MOSFET using DMOS type (double diffusion type) cells, reasoning that the DMOS type has productional advantages of high yield and low cost owing to the use of the planar process featured by the use of a flat main surface of a silicon wafer for the channel part.

On the other hand, along with the spread of the vertical power MOSFET, there is an increasing demand for lower loss and lower cost, while the ON-resistance reduction by means of microprocessing and cell shape improvement has reached the limits. According to the Japanese Unexamined Patent Publication No. 63-266882, for example, the DMOS type has the minimal point from which the ON-resistance will not decrease however small the unit cell dimension is made by microprocessing, and it has been known that the major cause of the existence of the minimal point is an increase in the JFET (junction field effect transistor) resistance constituting a component of the ON-resistance. Furthermore, as disclosed in the Japanese Unexamined Patent Publication No. 2-86136, the unit cell dimension with which the ON-resistance takes the minimal point is approximately 15 μm under the current microprocessing technology.

Various constructions have been proposed in an attempt to break through this limit. Common to these proposals is a construction in which a groove is formed on an element surface and a channel part is formed on a side surface of the groove, and this construction can substantially reduce the above JFET resistance. Furthermore, in a construction in which the channel part is formed on the groove side surface, even if the unit cell dimension is reduced, the consequent increase in the JFET resistance is negligible. Therefore, there is no limits that the ON-resistance takes the minimal point against the reduction in the unit cell dimension unlike the description in the Japanese Unexamined Patent Publication No. 63-266882, and the unit cell dimension can further be reduced to the limits of the microprocessing downwardly exceeding 15 μm.

Examples of the conventional manufacturing method with the above construction with the channel part on the groove side surface have been disclosed in the International Publication No. PCT WO93/03502 and the Japanese Unexamined Patent Publication No. 62-12167, for example, and the results of investigation have been disclosed in the ISPSD '93 pp.135–140.

FIG. 25(a) and FIG. 25(b) are a plane view and a cross-sectional view of the MOSFET disclosed in the International Publication No. PCT WO93/03502, and FIGS. 26 though 37 are cross-sectional views of the MOSFET illustrating the manufacturing process thereof according to the same publication.

The above manufacturing process will now be described.

First of all, as illustrated in FIG. 26, a wafer 21 is prepared with an n⁻-type epitaxial layer 2 developed on the main surface of a semiconductor substrate 1 made of n⁺-type silicon. This semiconductor substrate 1 has an impurity concentration of approximately $10^{20}$ cm$^{-3}$, while the n⁻type epitaxial layer 2 is developed to a thickness of approximately 7 μm and an impurity concentration of approximately $10^{16}$ cm$^{-3}$. A field oxide film 60 is formed to a thickness of approximately 60 nm by thermally oxidizing the main surface of the wafer 21, and then a resist film 61 is deposited and patterned by the publicly known photolithographic technique with the central part thereof open, the location of which being coincided with a location of cell formation. Then, boron ions (B$^+$) are implanted through the field oxide film 60 by using the resist film 61 as a mask.

After removing the resist film 61, as illustrated in FIG. 27, a p-type diffusion layer 62 is formed to a junction depth of approximately 3 μm. The p-type diffusion layer 62 ultimately becomes a part of a p-type base layer 16 (described herein later), and plays a role of improving the surge resistance by stably causing breakdown to the bottom part of the p-type diffusion layer 62 when a high voltage is applied to between a drain electrode and a source electrode.

Next, as illustrated in FIG. 27, a silicon nitride film 63 is deposited to a thickness of approximately 200 nm on the main surface of the wafer 21. The silicon nitride film 63 is patterned into a lattice-like open pattern with openings with a pitch (dimension of a unit cell 15) a. Incidentally, mask alignment is applied to the open pattern so that the p-type diffusion layer 62 can be positioned in the central part of the pitch.

Following the above, as illustrated in FIG. 28, the field oxide film 60 is etched by using the silicon nitride film 63 as a mask, and then a groove 64 is formed by etching the n⁻-type epitaxial layer 2 to a depth of approximately 1.5 μm.

As illustrated in FIG. 29, this time, the groove 64 is thermally oxidized by using the silicon nitride film 63 as a mask, which is a well known oxidizing technique as LOCOS (local oxidation of silicon). By this oxidation, a selective oxide film, i.e., a LOCOS oxide film 65 is formed, and concurrently a U-groove 50 is formed on the surface of the n⁻-type epitaxial layer 2 eroded by the LOCOS oxide film 65 and the shape of the groove 50 is fixed.

Then, as illustrated in FIG. 30, boron ions are implanted through a thin field oxide film 60 by using the LOCOS oxide film 65 as a mask to form the p-type base layer 16. In this process, the boundary surface between the LOCOS oxide film 65 and the field oxide film 60 is coincided with a self-alignment position, and accordingly a region into which boron ions are to be implanted can exactly be defined.

In the next process, as illustrated in FIG. 31, thermal diffusion is performed to obtain a junction depth of approximately 3 μm. By this thermal diffusion, the p-type diffusion layer 62 previously formed in the process illustrated in FIG. 27 and the diffusion layer of the boron ions implanted in the process illustrated in FIG. 30 are integrated into the single p-type base layer 16, and both end surfaces of the p-type base layer 16 are self-alignedly defined in the position of the side walls of the U-groove 50.

Now, as illustrated in FIG. 32, phosphorous ions are implanted through the thin field oxide film 60 by using both a resist film 66 patterned by a pattern left on the central part of the surface of the p-type base layer 16 surrounded by the LOCOS oxide film 65 formed on the surface of the wafer 21 by a lattice-like pattern and the LOCOS oxide film 65 to form the $n^+$-type source layer 4. In this process as well, like the ion implantation performed with boron ions in the process illustrated in FIG. 30, the boundary part between the LOCOS oxide film 65 and the field oxide film 60 is coincided with a self-alignment position, and accordingly a region into which phosphorous ions are to be implanted can exactly be defined.

After the above, as illustrated in FIG. 33, the $n^+$-type source layer 4 is formed and concurrently the channel 5 is set up by thermal diffusion to a junction depth of 0.5 to 1 μm. By this thermal diffusion, the end surface being in contact with the U-groove 50 in the region of the $n^+$-type source layer 4 is self-alignedly defined.

As a result of the processes illustrated in FIGS. 30 through 33, the junction depth and shape of the p-type base layer 16 can be fixed.

As illustrated in FIG. 34, now, the LOCOS oxide film 65 is removed by wet etching to expose an inside wall 51 of the U-groove 50, and then a gate oxide film 8 is formed to a thickness of approximately 60 nm by thermal oxidation.

Next, as illustrated in FIG. 35, a polysilicon film is deposited to a thickness of approximately 400 nm on the main surface of the water 21.

Following the above, as illustrated in FIG. 36, boron ions are implanted through the oxide film 67 by using the patterned resist film 68 as a mask in preparation for forming a $p^+$-type base contact layer 17.

Then, as illustrated in FIG. 37, the $p^+$-type base contact layer 17 is formed by the thermal diffusion to a junction depth of approximately 0.5 μm.

Subsequently, as illustrated in FIG. 25(b), an interlayer insulating film 18 is formed with BPSG (boron phosphate silicate glass) on the main surface of the wafer 21, and contact holes are made in parts of the interlayer insulating film 18 to expose the $p^+$-type base contact layer 17 and the $n^+$-type source layer 4. Furthermore, a source electrode 19 is formed with an aluminum film to achieve an ohmic contact between the source electrode 19 and the $p^+$-type base contact layer 17 and $n^+$-type source layer 4 through the contact holes. In addition, a passivation film (not illustrated) for protecting the aluminum film is formed by the plasma CVD method or the like using silicon nitride. On the other hand, on the back surface of the wafer 21 is formed a drain electrode 20 with three layers of a Ti film, a Ni film and a Au film and ohmically contacted with the $n^+$-type semiconductor substrate 1.

SUMMARY OF THE INVENTION

However, according to the above manufacturing method for a semiconductor device, a specified region of the low impurity concentration semiconductor layer is removed by the etching technique prior to the selective oxidation. As a result, a curve part is formed with the side surface of the etched groove and the surface of the semiconductor layer (709 in FIG. 8(a)). This curve part had been expected to become smooth during the subsequent selective oxidation process, but it was proved through experiments that this curve part remained even after the elective oxidation as a curve part with a small radius of curvature (710 in FIG. 8(b)).

According to this conventional manufacturing method, therefore, the channel region is formed including this curve part, and the carrier mobility is lowered by this curve part and a low ON-state voltage can not be achieved.

With the above problem in view, a primary object of the present invention is to obtain a manufacturing method for a semiconductor device which can achieve a low ON-state voltage by forming a groove by the etching technique prior to the selective oxidation and then selectively oxidizing a region including the groove and using the side surface of this groove as a channel part.

In order to achieve the above objective, the manufacturing method according to the present invention comprises: an etching process for forming a groove on a first conductivity type semiconductor layer, which is on the surface of a semiconductor substrate and has an impurity concentration lower than that of the semiconductor substrate, by etching a specified region of a surface of the semiconductor layer of a low impurity concentration as a main surface; a selective oxidation process for forming a selective oxide film to a specified thickness from the main surface within the semiconductor layer within the specified region by selectively oxidizing a region including an inside surface of the groove formed by the etching process; an impurity introduction process for forming a channel on a part deeper than a curve part located on an inlet part of the groove by diffusing second conductivity type and first conductivity type impurities from the main surface to form the channel on the surface of the semiconductor layer being in contact with a side surface of the selective oxide film and concurrently turning the semiconductor layer to be a first conductivity type drain layer by forming a second conductivity type base layer and a first conductivity type source layer; a gate formation process for forming a gate electrode on a gate oxide film by forming a groove to a specified depth by removing the selective oxide film and making the gate oxide film by oxidizing an inside wall of the groove including the part on which the channel is formed; and a source and drain electrode formation process for forming a source electrode which is to electrically contact both the source layer and the base layer, and for forming a drain electrode which is to electrically contact the other surface of the semiconductor substrate.

In the manufacturing method for a semiconductor device as composed above, it is preferable that the impurity introduction process should comprise a process in which the second conductivity type and first conductivity impurities are doubly diffused from the side of the main surface in a successive manner in self-alignment with the selective oxide film to form the channel on the surface of the semiconductor layer being in contact with a side surface of the selective oxide film and the channel is formed by the double diffusion on the part deeper than the curve part located on the inlet part of the groove and concurrently the semiconductor layer is turned to be the first type conductivity drain layer by forming the second conductivity type base layer and the first conductivity type source layer.

According to the present invention constructed as described above, a specified region of the surface of the low impurity concentration semiconductor layer is removed by etching prior to selective oxidation. In this process, a curve part is formed with the side surface of the etched groove and the surface of the semiconductor layer, and this curve part remains as a curve part even after the subsequent selective oxidation process. To counter this curve part, the channel region is formed in a region deeper than the curve part. As a result, the channel region in which electrons flow through a very thin inversion layer becomes flat, and the disturbance to the electron flow due to the influence of the curve part can be prevented, whereby the manufacturing method for a semiconductor device which can achieve a low ON-state voltage can be obtained.

BRIEF DESCRIPTION OF THE DRAWINGS

These and other objects, features and characteristics of the present invention will be appreciated from a study of the following detailed description, the appended claims, and drawings, all of which form a part of this application. In the drawings:

DETAILED DESCRIPTION OF THE PRESENTLY PREFERRED EXEMPLARY EMBODIMENTS

An embodiment according to the present invention will now be described referring to the appended drawings.

Figure 1A:
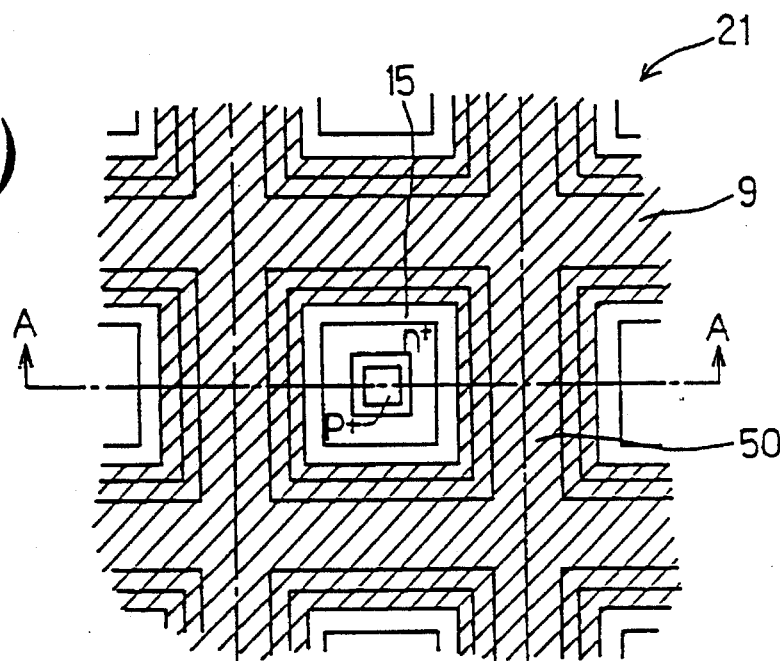
FIG. 1(a) is a plane view illustrating a part of the vertical type power MOSFET of the first embodiment according to the present invention.
Figure 1B:
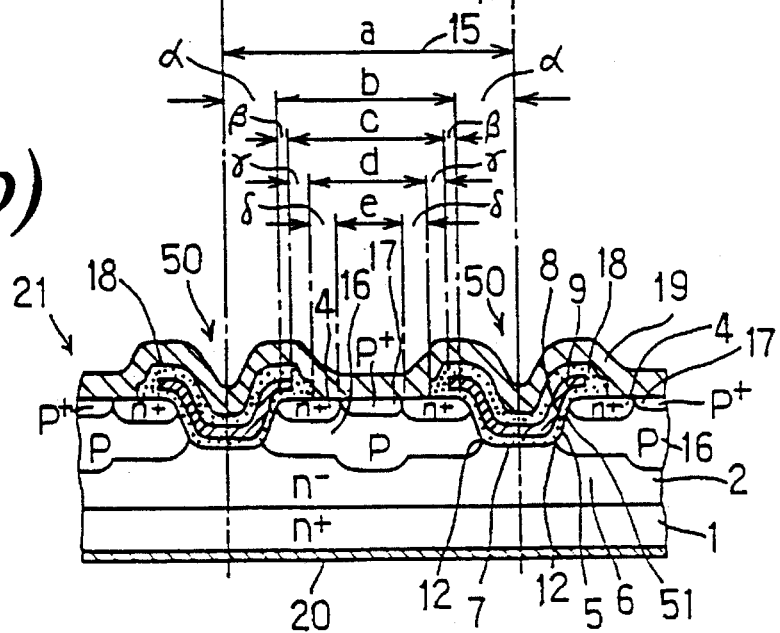
FIG. 1(b) is a cross-sectional view taken along line A—A of FIG. 1(a)
Figure 4:
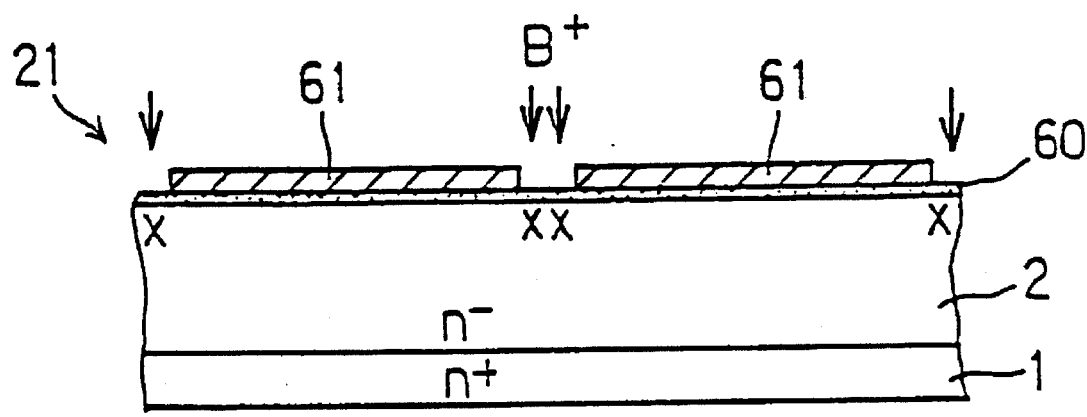
FIG. 4 is a cross-sectional view illustrating the manufacturing process of an important part of the vertical type power MOSFET of the first embodiment according to the present invention.
Figure 5:
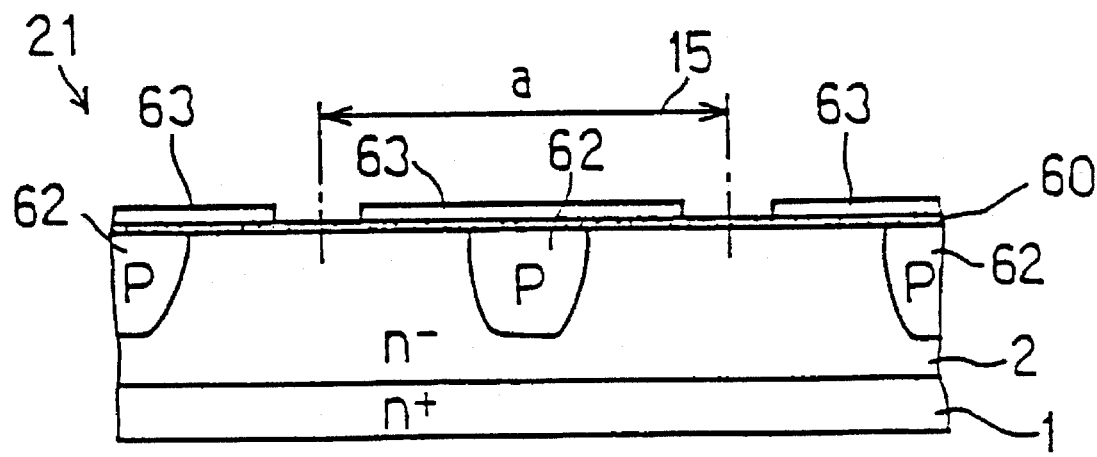
FIG. 5 is a cross-sectional view illustrating the manufacturing process of the important part of the vertical type power MOSFET of the first embodiment according to the present invention.
Figure 10:
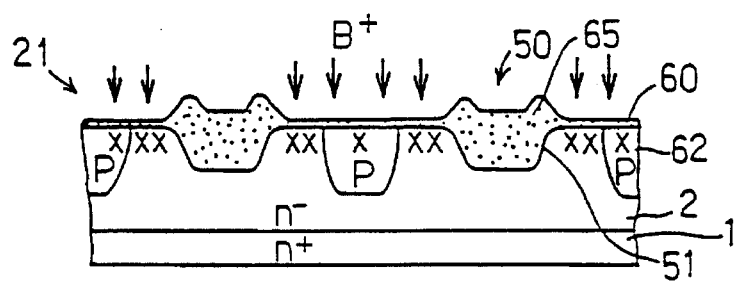
FIG. 10 is a cross-sectional view illustrating the manufacturing process of the important part of the vertical type power MOSFET of the first embodiment according to the present invention.
Figure 11:
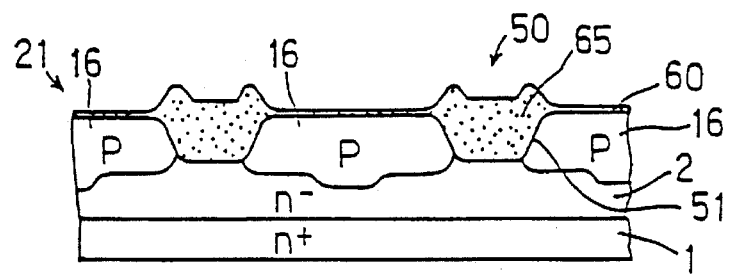
FIG. 11 is a cross-sectional view illustrating the manufacturing process of the important part of the vertical type power MOSFET of the first embodiment according to the present invention.
Figure 12:
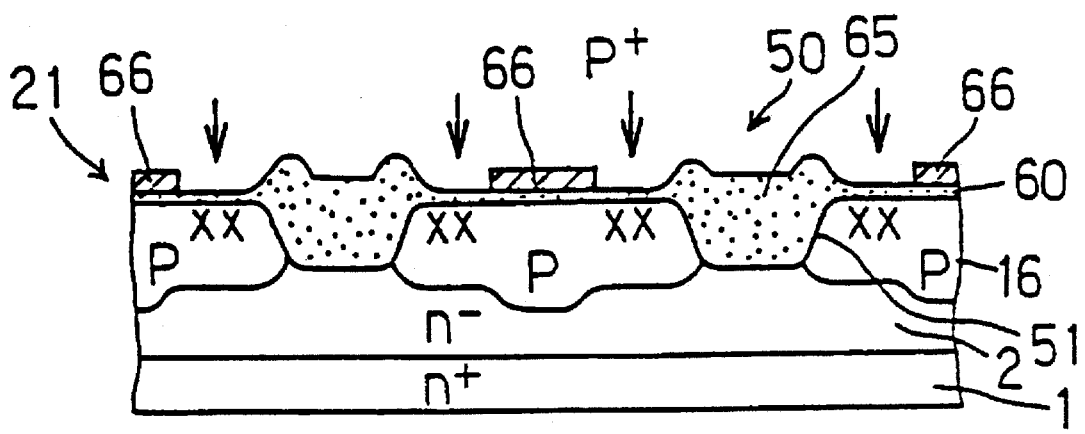
FIG. 12 is a cross-sectional view illustrating the manufacturing process of the important part of the vertical type power MOSFET of the first embodiment according to the present invention.
Figure 13:
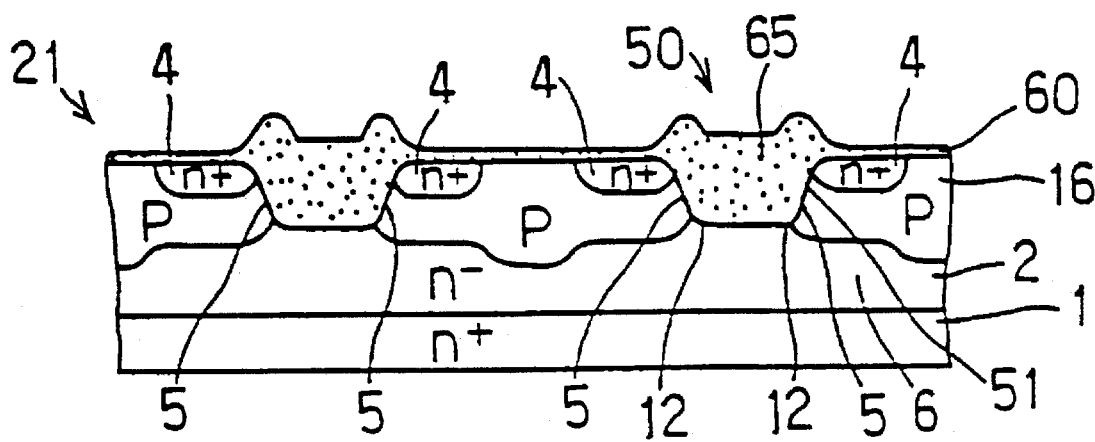
FIG. 13 is a cross-sectional view illustrating the manufacturing process of the important part of the vertical type power MOSFET of the first embodiment according to the present invention.
Figure 22:
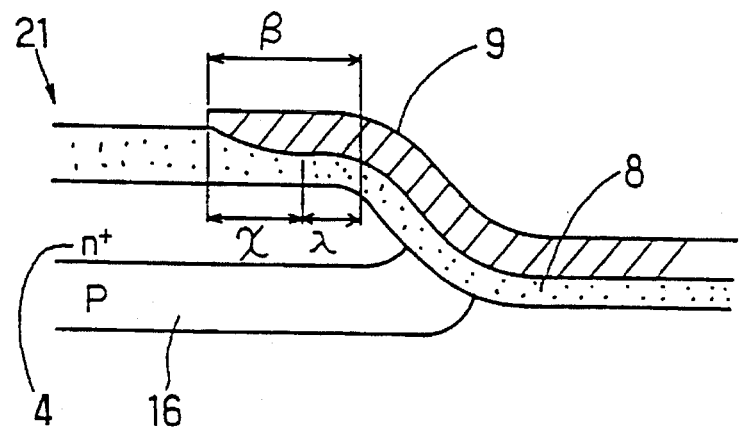
FIG. 22 is a cross-sectional view illustrating the manufacturing process of the important part of the vertical type power MOSFET of the first embodiment according to the present invention.
Figure 20:
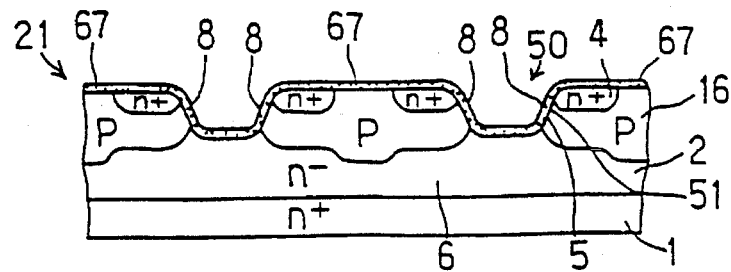
FIG. 20 is a cross-sectional view illustrating the manufacturing process of the important part of the vertical type power MOSFET of the first embodiment according to the present invention.
Figure 21:
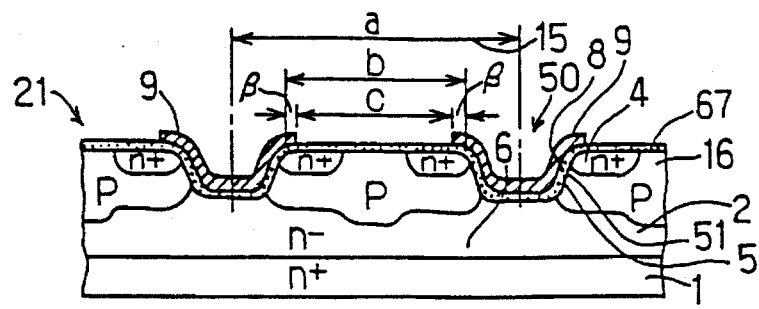
FIG. 21 is a cross-sectional view illustrating the manufacturing process of the important part of the vertical type power MOSFET of the first embodiment according to the present invention.
Figure 23:
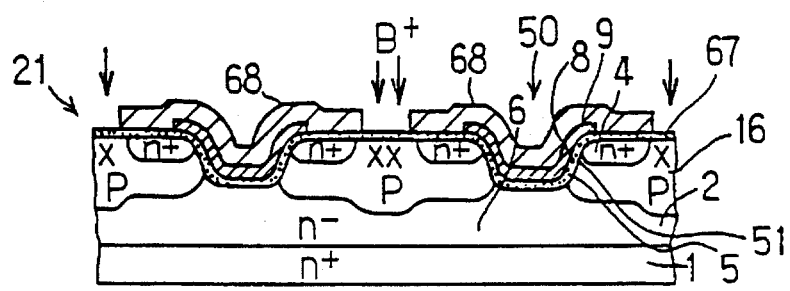
FIG. 23 is a cross-sectional view illustrating the manufacturing process of the important part of the vertical type power MOSFET of the first embodiment according to the present invention.
Figure 24:
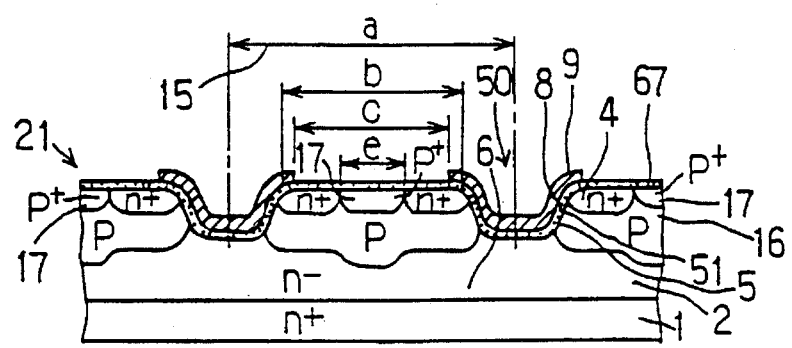
FIG. 24 is a cross-sectional view illustrating the manufacturing process of the important part of the vertical type power MOSFET of the first embodiment according to the present invention.
Figure 25A:
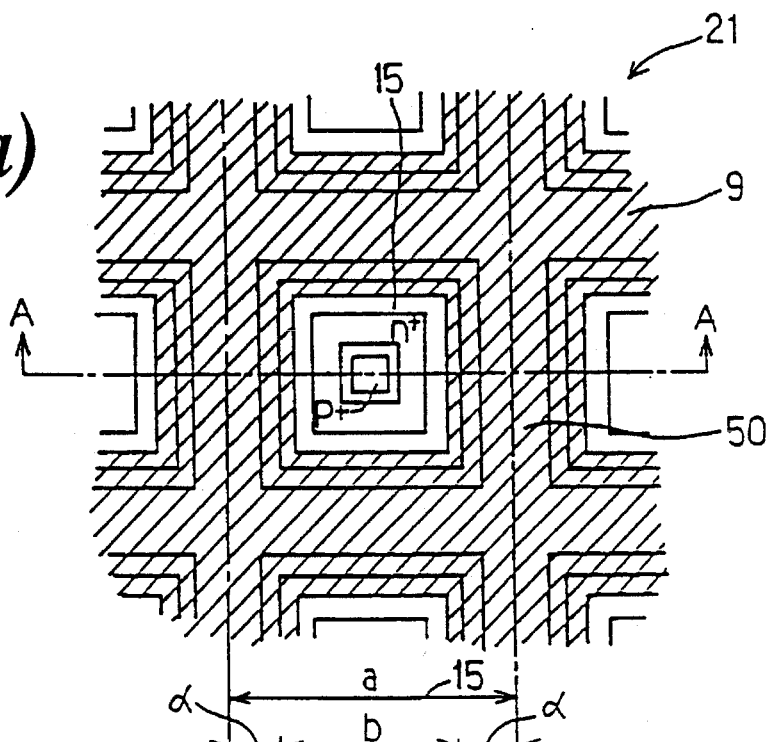
FIG. 25(a) is a plane view illustrating a part of a conventional power MOSFET.
Figure 25B:
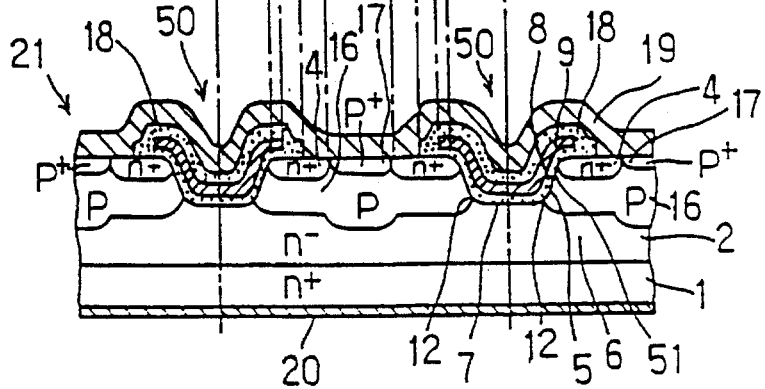
FIG. 25(b) is a cross-sectional view taken along line A—A of FIG. 25(a)
Figure 26:
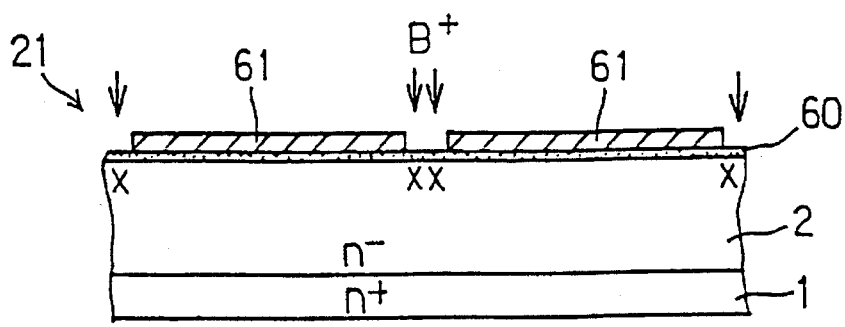
FIG. 26 is a cross-sectional view illustrating the manufacturing process of an important part of the conventional vertical type power MOSFET.
Figure 27:
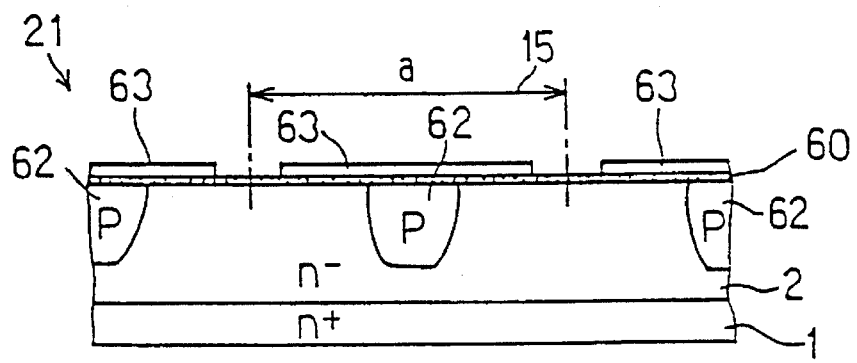
FIG. 27 is a cross-sectional view illustrating the manufacturing process of the important part of the conventional vertical type power MOSFET.
Figure 28:
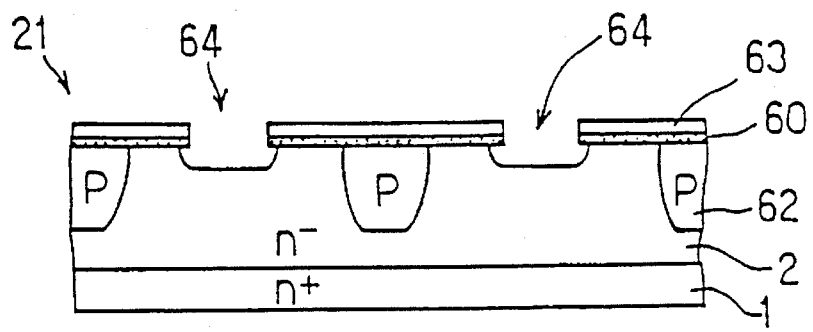
FIG. 28 is a cross-sectional view illustrating the manufacturing process of the important part of the conventional vertical type power MOSFET.
Figure 29:
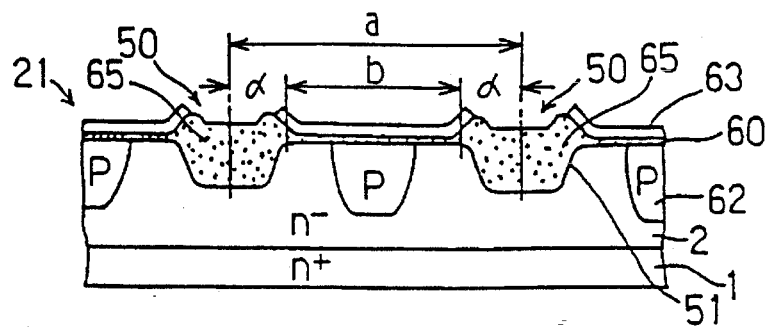
FIG. 29 is a cross-sectional view illustrating the manufacturing process of the important part of the conventional vertical type power MOSFET.
Figure 30:
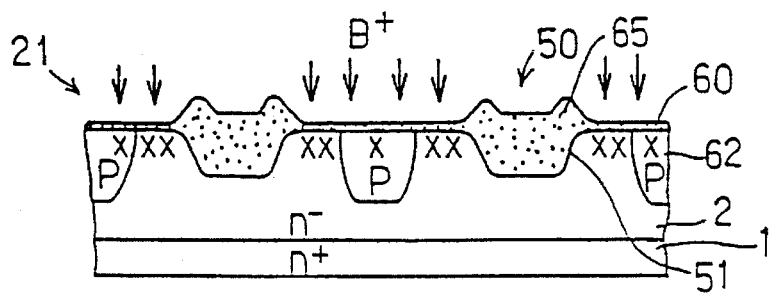
FIG. 30 is a cross-sectional view illustrating the manufacturing process of the important part of the conventional vertical type power MOSFET.
Figure 31:
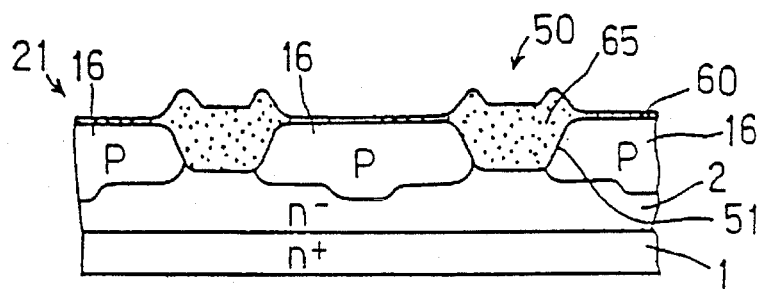
FIG. 31 is a cross-sectional view illustrating the manufacturing process of the important part of the conventional vertical type power MOSFET.
Figure 32:
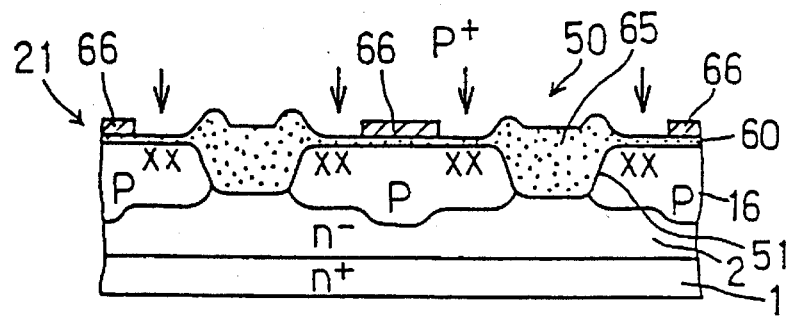
FIG. 32 is a cross-sectional view illustrating the manufacturing process of the important part of the conventional vertical type power MOSFET.
Figure 33:
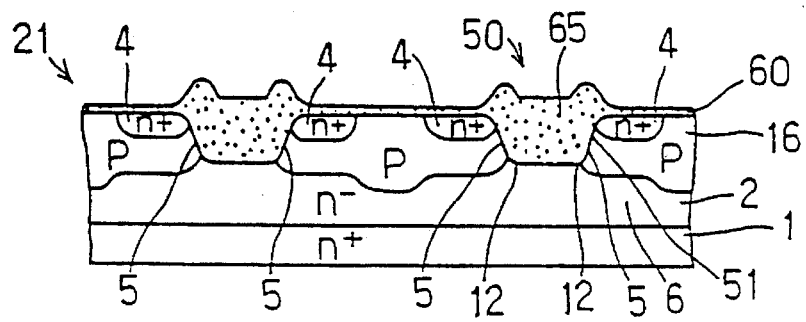
FIG. 33 is a cross-sectional view illustrating the manufacturing process of the important part of the conventional vertical type power MOSFET.
Figure 34:
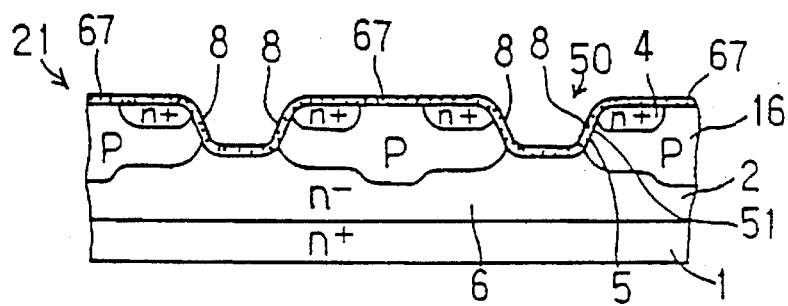
FIG. 34 is a cross-sectional view illustrating the manufacturing process of the important part of the conventional vertical type power MOSFET.
Figure 35:
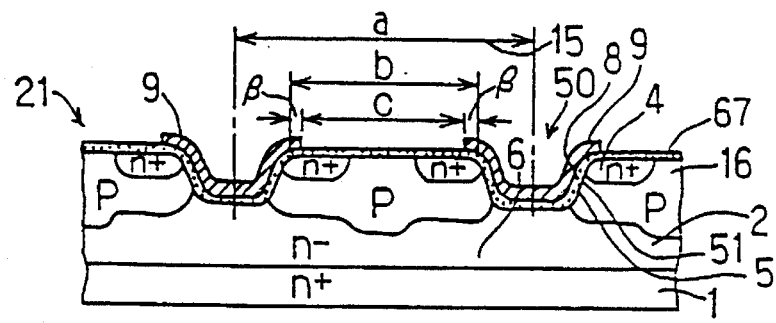
FIG. 35 is a cross-sectional view illustrating the manufacturing process of the important part of the conventional vertical type power MOSFET.
Figure 36:
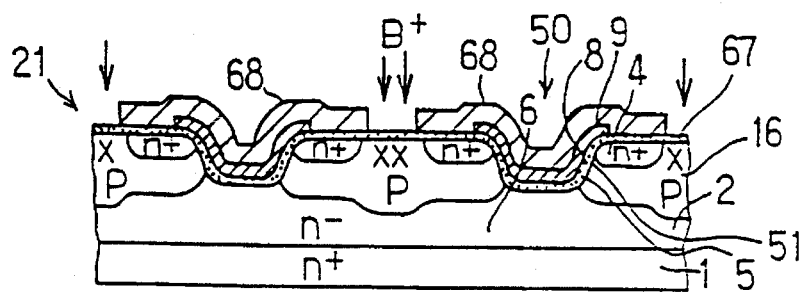
FIG. 36 is a cross-sectional view illustrating the manufacturing process of the important part of the conventional vertical type power MOSFET.
Figure 37:
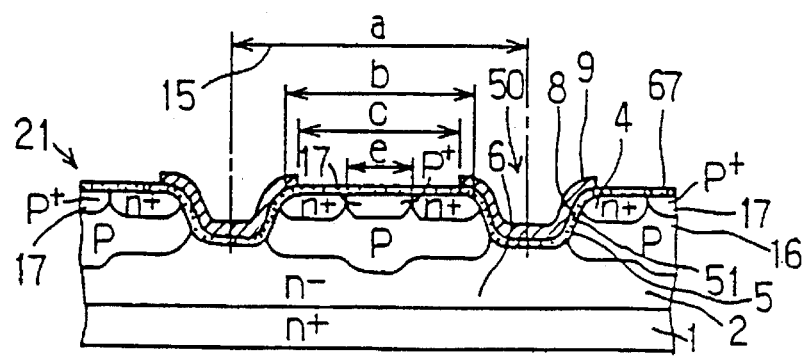
FIG. 37 is a cross-sectional view illustrating the manufacturing process of the important part of the conventional vertical type power MOSFET.

FIG. 1(a) is a plan view of a vertical type power MOSFET composed of a numerosity of square unit cells according to the first embodiment of the present invention, and FIG. 1(b) is a cross-sectional view taken along line A—A of FIG. 1(a). FIGS. 2 through 24 are descriptive views of the respective stages of the manufacturing method for a vertical type power MOSFET according to the first embodiment, wherein FIG. 4 is a cross-sectional view of a wafer into which boron ions have been implanted to form a central part of a p-type base layer; FIG. 5 is a cross-sectional view of the wafer whose silicon nitride film has been patterned at a pitch which is equal to the dimension of a unit cell a for the LOCOS (localized oxidation of silicon); FIG. 9 is a cross-sectional view of the wafer on which the LOCOS oxide film has been formed; FIG. 10 is a cross-sectional view of the wafer into which boron ions have been implanted to form a p-type base layer by using the LOCOS oxide film as a mask; FIG. 11 is a cross-sectional view of the wafer on which the p-type base has been formed by means of thermal diffusion; FIG. 12 is a cross-sectional view of the wafer into which phosphorous ions have been implanted to form an n⁺-type source layer by using the LOCOS oxide film as a mask; FIG. 13 is a cross-sectional view of the wafer on which the n⁺-type source layer has been formed by means of thermal diffusion; FIG. 20 is a cross-sectional view of the wafer on which a gate oxide film has been formed by means of thermal oxidation since the removal of the LOCOS oxide film; FIG. 21 is a cross-sectional view of the wafer with a gate electrode formed on the gate oxide film; FIG. 23 is a cross-sectional view of the wafer into which boron ions have been implanted to form a p⁺-type base contact layer; FIG. 24 is a cross-sectional view of the wafer on which the p⁺-type base contact layer has been formed by means of thermal diffusion; and FIG. 1(b) is the cross-sectional view of the completed wafer on which an interlayer insulating film, a source electrode and a drain electrode have been formed.

The main part (unit cell part) of the vertical type power MOSFET according to this embodiment is so constructed as illustrated in FIGS. 1(a) and 1(b) in which a numerosity of unit cells 15 are laid out lengthwise and breadthwise with ordination at a pitch (unit cell dimension) of a.

In FIGS. 1(a) and 1 (b), a wafer 21 is composed of a semiconductor substrate 1 comprising an n⁺-type silicon having an impurity density of $10^{20}$ cm$^{-3}$ and a thickness of 100 to 300 μm, an n⁻-type epitaxial layer 2 having an impurity density of approximately $10^{16}$cm$^{-3}$ and a thickness of approximately 7 μm formed on the semiconductor substrate 1, and a unit cell 15 formed on the main surface of the wafer 21. On the main surface of the wafer 21 is formed a LOCOS oxide film to a thickness of approximately 3 μm to form a U-groove 50 at a pitch of the unit cell dimension a (=approximately 12 μm), and by using this oxide film are formed a p-type base layer 16 to a junction depth of approximately 3 μm and an n⁺-type source layer 4 to a junction depth of approximately 1 μm, whereby a channel 5 is set on the side wall part 51 of the U-groove 50. Incidentally, the p-type base layer 16 is set to a junction depth which does not permit the p-type layer 16 to be fractured due to breakdown at an edge part 12 on the bottom of the U-groove 50. Furthermore, boron ions have been implanted into the central part of the p-type base layer 16 beforehand to deepen the junction depth in the central part of the p-type layer 16 down from the circumference, so that a breakdown can be caused when a high voltage is applied to between the drain electrode and the source electrode. After the double diffusion, the diffusion mask and the LOCOS oxide film used for forming the U-groove 50 are removed, a gate oxide film 8 is formed to a thickness of approximately 60 nm on the inner wall of the U-groove 50, and on the gate oxide film 8 are formed a gate electrode 9 with a polysilicon to a thickness of approximately 400 nm and an interlayer insulating film 18 with a BPSG to a thickness of approximately 1 μm. Furthermore, a p⁺-type base contact layer 17 is formed to a junction depth of approximately 0.5 μm in the central part surface of the p-type base layer 16, and ohmic contact is made between a source electrode 19 formed on the interlayer insulating film 18 and the n⁺-type source layer 4 and p⁺-type base contact layer 17 through contact holes. On the other hand, a drain electrode 20 is formed on the back surface of the semiconductor substrate 1 to make ohmic contact therewith.

An example of the manufacturing method according to this embodiment will now be described.

Figure 2:
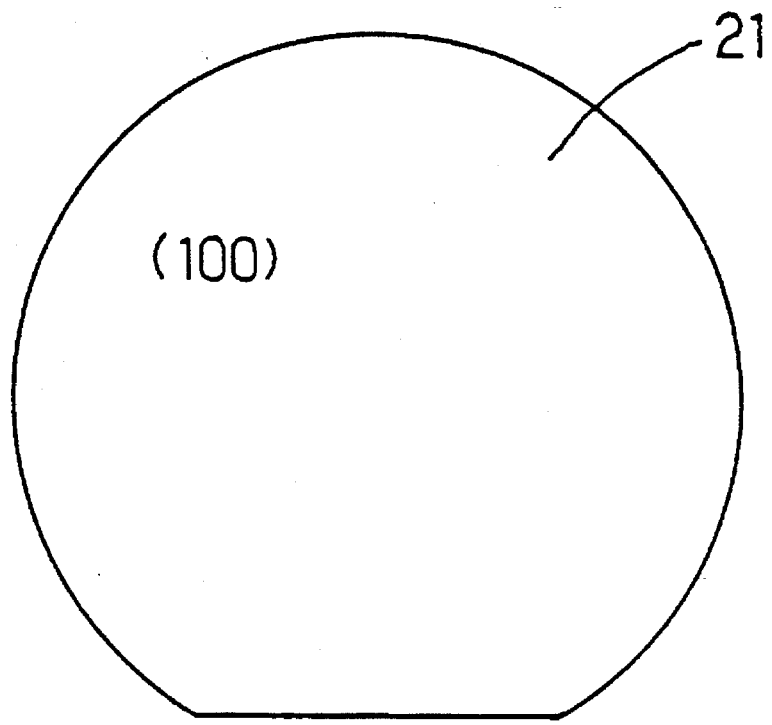
FIG. 2 is a view illustrating the manufacturing process of the vertical type power MOSFET of the first embodiment according to the present invention.
Figure 3:
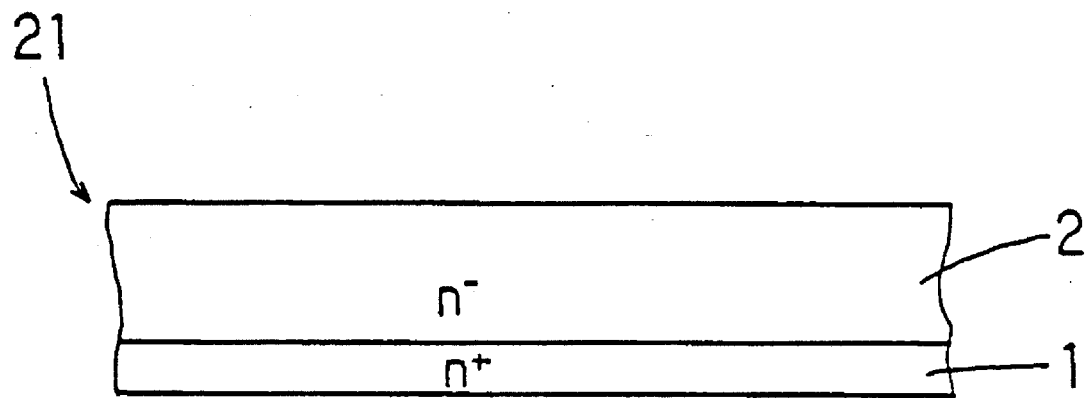
FIG. 3 is a cross-sectional view illustrating the manufacturing process of the vertical type power MOSFET of the first embodiment according to the present invention.

A wafer 21 is prepared in which, as illustrated in FIGS. 2 and 3, an n⁻-type epitaxial layer 2 is formed by means of epitaxial growth on the main surface of the semiconductor substrate 1 having the index of plane of (100). The impurity concentration of this semiconductor substrate 1 is approximately $10^{20}$ cm$^{-3}$, and the thickness of the epitaxial layer 2 is approximately 7 μm and the impurity concentration thereof is approximately $10^{16}$ cm$^{-3}$. Then, as illustrate in FIG. 4, a field oxide film 60 is formed to a thickness of approximately 60 nm by thermally oxidizing the main surface of the wafer 21, and subsequently a resist film 61 is deposited on the field oxide film 60 and the resist film is patterned to form a pattern opened in the central part of a region where a cell is to be formed by means of the publicly known photolithographic technique. Then, boron (B⁺) ions are implanted into the field oxide film 60 by using the resist film 61 as a mask.

As illustrated in FIG. 5, after removing the resist, a p-type diffusion layer 62 is formed to a junction depth of approximately 3 μm by means of thermal diffusion. This p-type diffusion layer 62 ultimately constitutes a part of the p-type base layer 16 (described herein later) and plays a role of improving the surge resistance of the device by stably causing a breakdown at the bottom part of the p-type diffusion area when a high voltage is applied to between the drain electrode and the source electrode.

Figure 6:
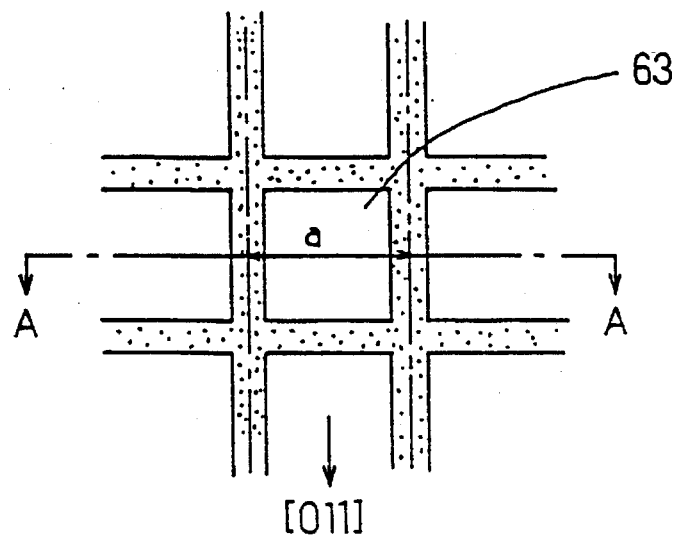
FIG. 6 is a plane view illustrating the manufacturing process of an important part of the vertical type power MOSFET of the first embodiment according to the present invention.

Furthermore, as illustrated in FIG. 5, a silicon nitride film 63 is deposited to a thickness of approximately 200 nm on the main surface of the wafer 21. Then, as illustrated in FIG. 6, the silicon nitride film 63 is patterned to be vertical and parallel to the direction <011> to form a lattice-like open pattern opening at a pitch of a (dimension of unit cell 15). This open pattern is mask-aligned so that the above p-type diffusion layer 62 can be positioned in the central part of the pitch.

Figure 7:
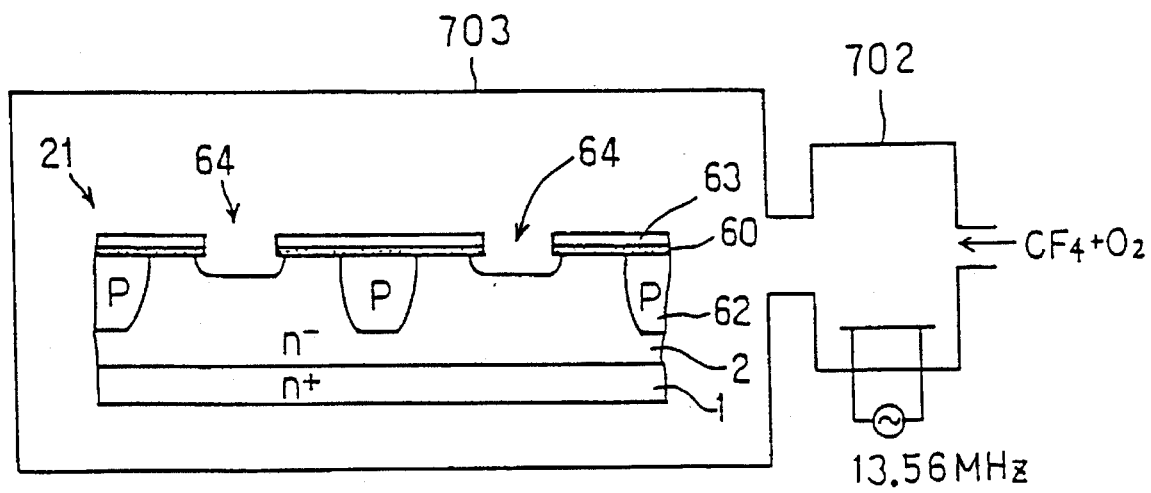
FIG. 7 is a view illustrating the manufacturing process of the vertical type power MOSFET of the first embodiment according to the present invention.
Figure 8A:
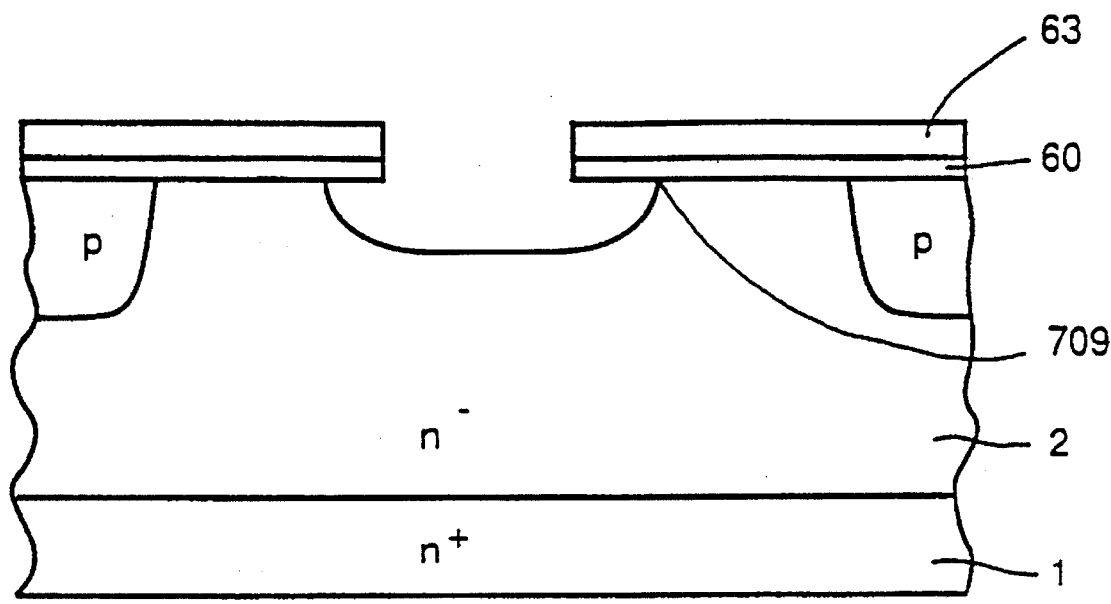
FIGS. 8(a) and 8(b) are views illustrating the manufacturing process of the vertical type power MOSFET of the first embodiment according to the present invention.

The field oxide film 60 is etched by using the silicon nitride film 63 as a mask. Following this, as illustrated in FIG. 7, a chemically active species is made by generating plasma within a discharge chamber 703 containing a carbon tetrafluoride and oxygen gas, and the active species is transported into a reaction chamber 703, and a groove 64 is formed by isogonally applying chemical dry etching to the $n^-$-type epitaxial layer 2 within the reaction chamber 703. In this process, as illustrated in FIG. 8(a), a curve part 709 is formed with the surface of the semiconductor substrate 1 and the groove 64.

Figure 8B:
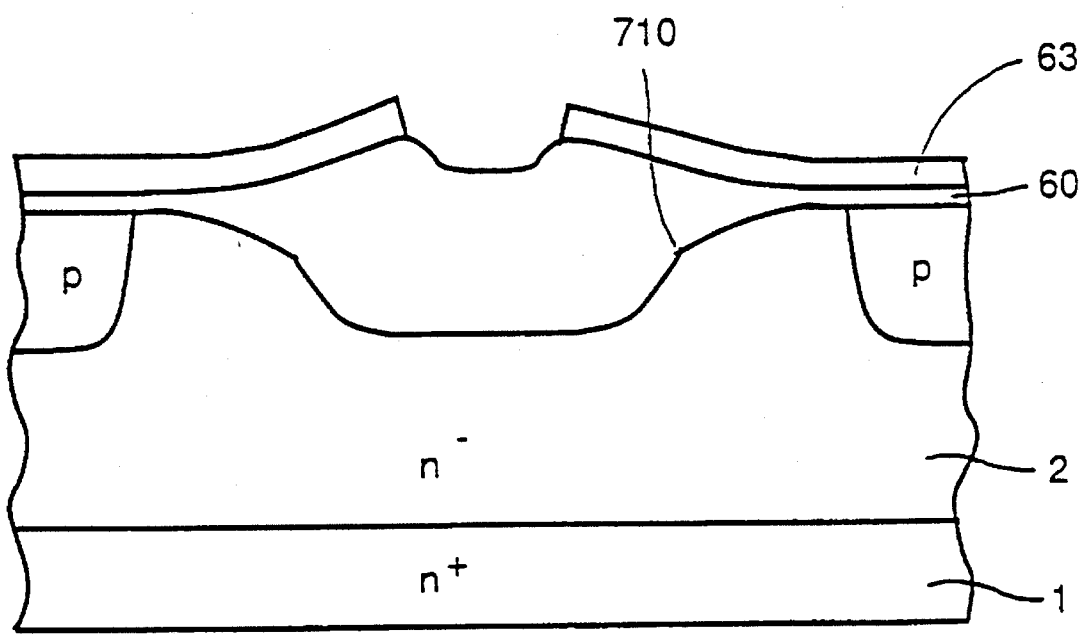
Figure 9:
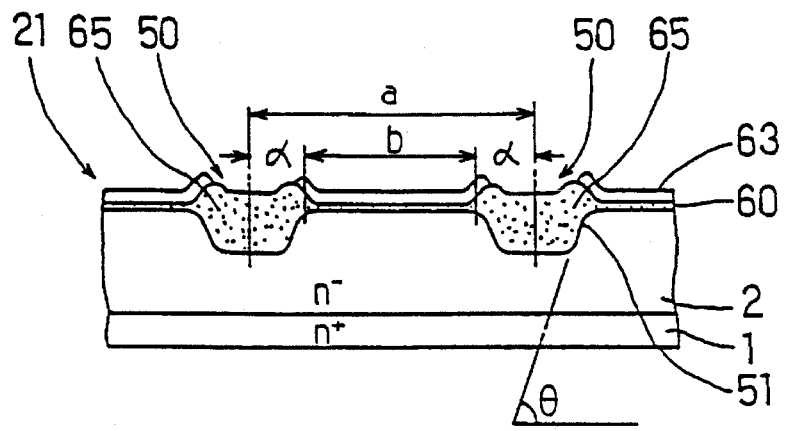
FIG. 9 is a cross-sectional view illustrating the manufacturing process of the important part of the vertical type power MOSFET of the first embodiment according to the present invention.

Then, as illustrated in FIGS. 8(b) and 9, the groove 64 is thermally oxidized, by using the silicon nitride film 63 as a mask, which is an oxidizing method well known as the LOCOS (local oxidation of silicon) method. By this oxidation, a LOCOS oxide film 65 is formed and concurrently the U-groove 50 is formed on the surface of the $n^-$-type epitaxial layer 2 eroded by the LOCOS oxide film 65, whereby the U-groove shape is fixed, leaving the curve part 709 formed during the chemical dry etching process as a curve part 710 on the side surface of the U-groove 50.

In the above process, the conditions of the chemical dry etching and LOCOS oxidation are selected so that the index of plane of the channel forming part on the side surface of the U-groove 50 can be approximates to (111).

The inside wall surface 51 of the U-groove 50 formed by the LOCOS oxidation as described above has a high flatness and a few defects, and the surface condition thereof is as good as the main surface of the wafer 21 in the initial stage illustrated in FIG. 2.

Now, as illustrated in FIG. 10, boron ions are implanted through the thin field oxide film 60 by using the LOCOS oxide film 65 as a mask to form the p-type base layer 16. As a result, the boundary part between the LOCOS oxide film 65 and the field oxide film 60 constitutes a self-alignment position to exactly define a region into which boron ions are implanted.

Then, as illustrated in FIG. 11, thermal diffusion is applied to the field oxide film 60 to a junction depth of approximately 3 μm. As the result of this thermal diffusion, the p-type diffusion layer 62 previously formed in the process illustrated in FIG. 5 and the boron diffusion region into which boron ions have been implanted in the process illustrated in FIG. 10 are integrated into the p-type base layer 16, both ends of which are self-aligned and defined by the positions of the side walls of the U-groove 50.

Subsequently, as illustrated in FIG. 12, phosphorous ions are implanted through the thin field oxide film 60 by using a resist film 66 patterned according to the pattern left on the central part of the surface of the p-type base layer 16 surrounded by the LOCOS oxide film 65 formed on the surface of the wafer 21 according to the lattice-like pattern and the LOCOS oxide film 65 as masks to form the $n^+$-type source layer 4. In this process, like the process illustrated in FIG. 9 in which boron ions have been implanted, the boundary part between the LOCOS oxide film 65 and the field oxide film 60 constitutes a self-alignment position, whereby the ion implantation region can exactly be defined.

Figure 14:
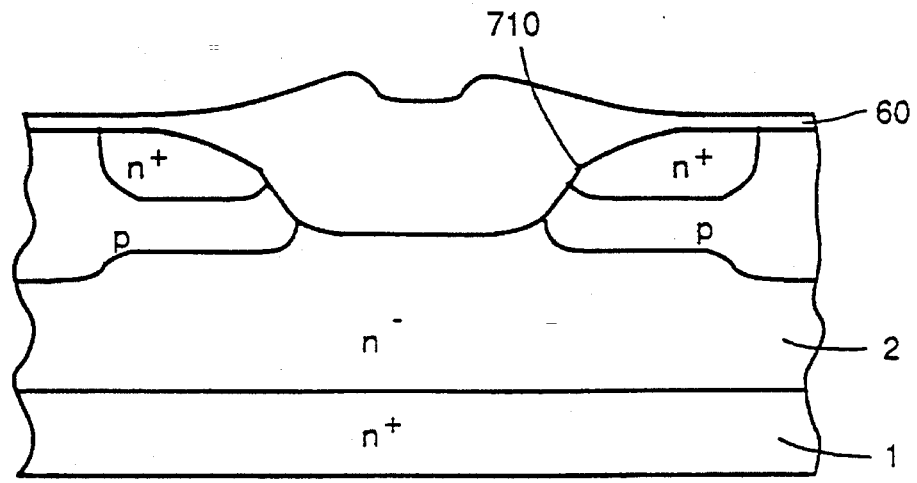
FIG. 14 is an enlarged view illustrating the manufacturing process of the vertical type power MOSFET of the first embodiment according to the present invention.

The next process is, as illustrated in FIG. 13, to apply thermal diffusion to a junction depth of 0.5 to 1 μm to form the $n^+$-type source layer 4 and set the channel 5 as well. The junction depth obtained by this thermal diffusion obtained during the previous etching which is set to be deeper than the curve part 710 survived on the side surface of the U-groove 50 through the previous selective oxidation as illustrated in FIG. 14. The end surface being in contact with the U-groove 50 in the region of the $n^+$-type source layer 4 is self-aligned and defined in the position of the side wall of the U-groove 50.

The processes illustrated in FIGS. 10 to 13 fix the junction depth and shape of the n-type base layer 16. Here, a point is that the shape of the p-type base layer 16 is perfectly symmetric with respect to the U-groove 50 due to the self-alignment and thermal diffusion.

Figure 15:
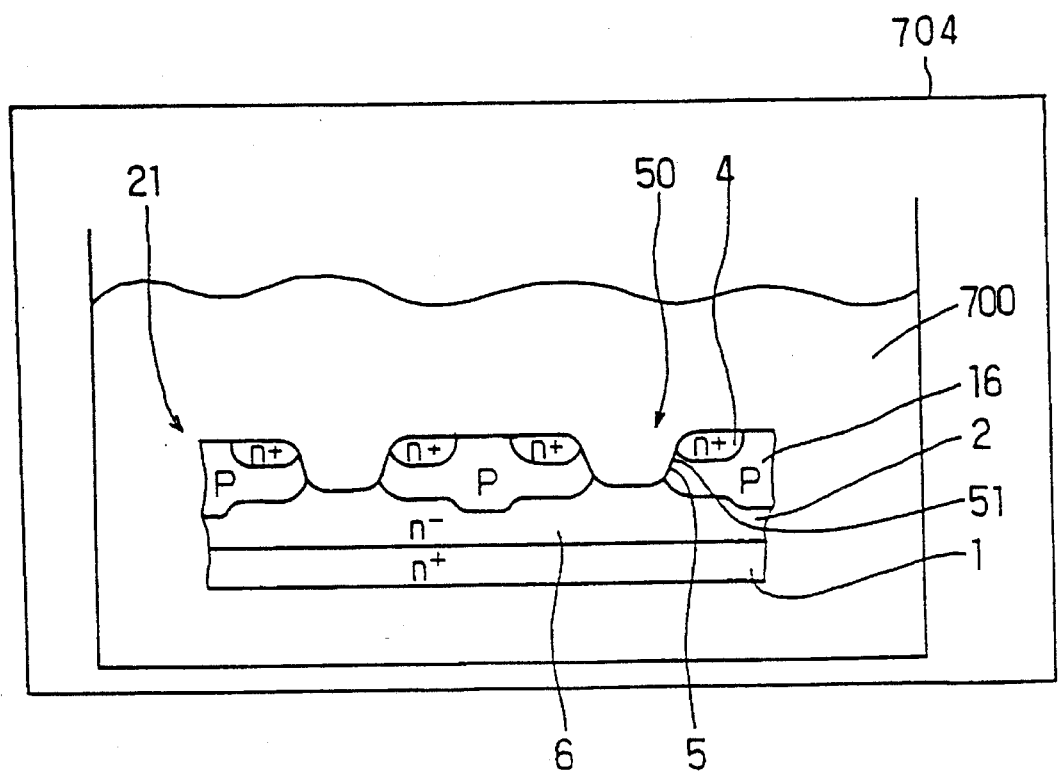
FIG. 15 is a view illustrating the manufacturing process of the vertical type power MOSFET of the first embodiment according to the present invention.

Next, as illustrated in FIG. 15, an inside wall 51 of the U-groove 50 is exposed by removing the LOCOS oxide film 65 by way of applying an end effect to the silicon surface with hydrogen within an aqueous solution containing hydrofluoric acid and adjusted to an acidity/alkalinity of around pH5 with ammonium fluoride. This process should be performed by applying an shading cloth over the wafer 21 to shade the surface with the selective oxide film from light.

After the completion of the above process, the wafer 1 is taken out of the aqueous solution and dries in a clean air.

Figure 16:
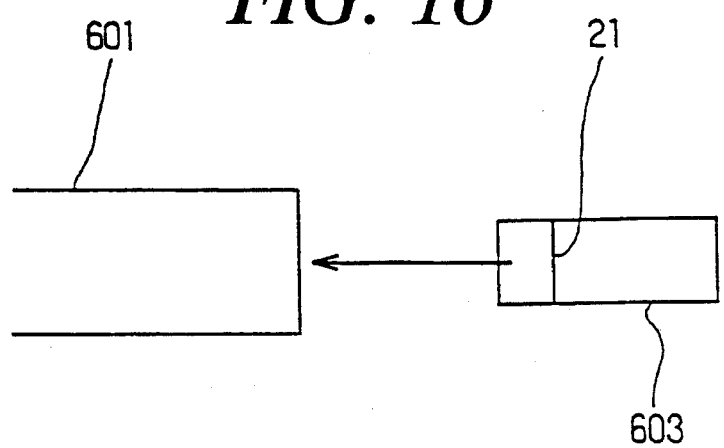
FIG. 16 is a view illustrating the manufacturing process of the vertical type power MOSFET of the first embodiment according to the present invention.
Figure 17:
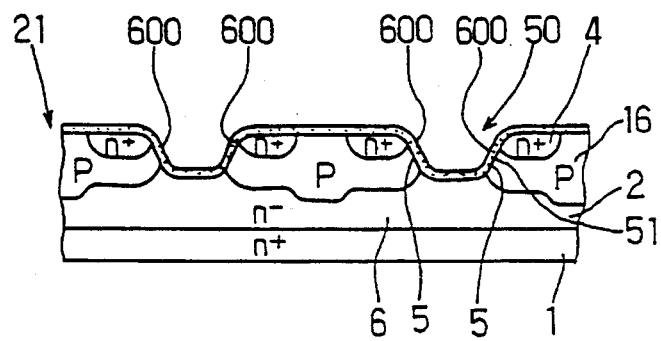
FIG. 17 is a cross-sectional view illustrating the manufacturing process of the important part of the vertical type power MOSFET of the first embodiment according to the present invention.
Figure 18:
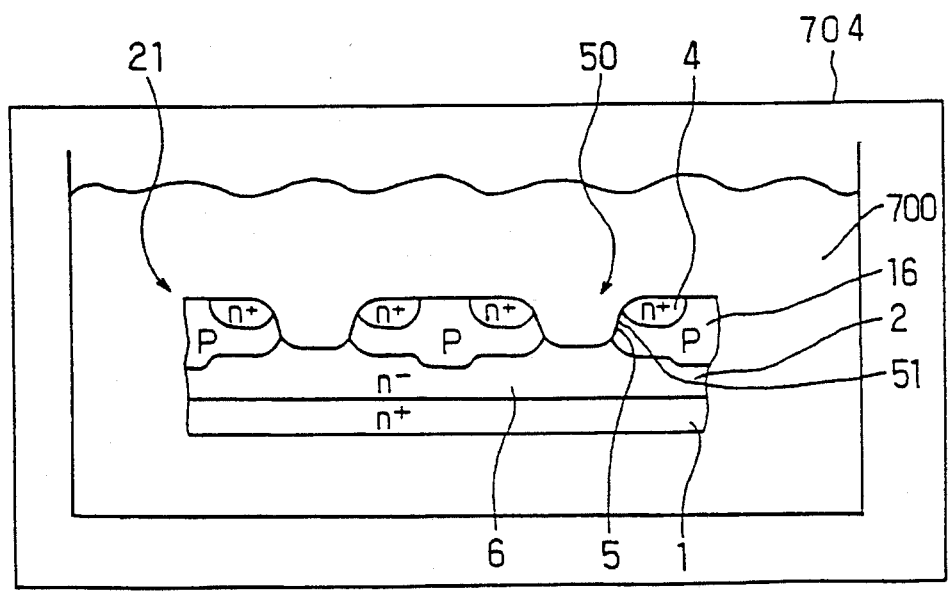
FIG. 18 is a view illustrating the manufacturing process of the vertical type power MOSFET of the first embodiment according to the present invention.
Figure 19:
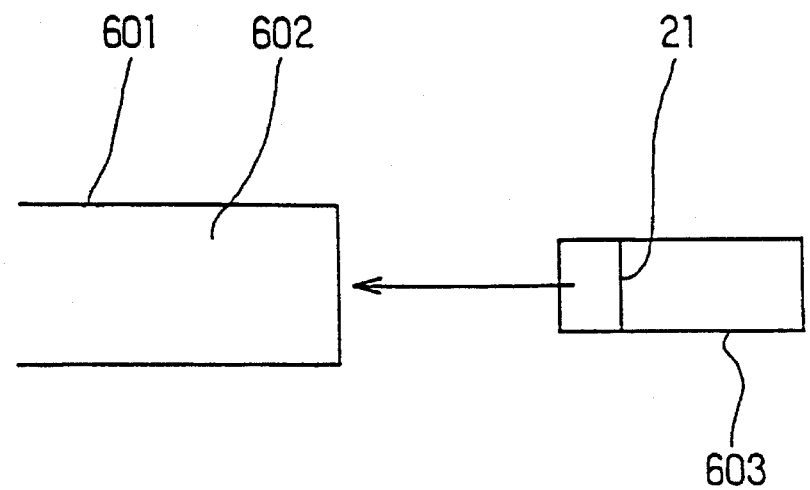
FIG. 19 is a view illustrating the manufacturing process of the vertical type power MOSFET of the first embodiment according to the present invention.

Then, as illustrated in FIG. 17, an oxide film is formed on a side surface of the U-groove 50 of the p-type base layer 16 on which the channel 5 is to be formed until the (111) plane is formed. By this thermal oxidation process, the flatness of the surface on which the channel 5 is to be formed is improved in terms of atomic order. As illustrated in FIG. 16, this thermal oxidation process is performed by slowly inserting the wafer 21 into an oxidation furnace 601 which is maintained within the oxygen atmosphere at a temperature of approximately 1000° C. In this thermal oxidation process, as the initial stage of the oxidation is performed at a comparatively low temperature, the scattering of impurities within the p-type base layer region 16 and $n^+$-type source region 4 to the outside of the wafer 21 during the thermal oxidation process can be controlled. Then, an oxide film 600 thus formed is removed as illustrated in FIG. 18. The removal of the oxide film 600 is also performed by way of applying an end effect to the exposed silicon surface with hydrogen within an aqueous solution containing hydrofluoric acid and adjusted to an acidity/alkalinity of around pH5 with ammonium fluoride. The inside wall surface 51 of the U-groove 50 formed by this method is a good silicon surface with a high flatness and a few defects.

As illustrated in FIG. 20 this time, a gate oxide film 8 is formed to a thickness of approximately 60 nm on the side surface and bottom surface of the U-groove 50 by thermal oxidation. This thermal oxidation process is, as described above, performed by slowly lowering the wafer 21 into an oxidation furnace 601 which is maintained within the oxygen atmosphere 602 (FIG. 19) and at a temperature of approximately 1000° C. In this thermal oxidation process, as the initial stage of the oxidation is performed at a comparatively low temperature, the scattering of impurities within the p-type base layer region 16 and n⁺-type source region 4 to the outside of the wafer 21 during the thermal oxidation process can be controlled. The film quality and thickness uniformity of the gate oxide film 8, the interface interfacial sequence density of the interface of the channel 5 and the carrier mobility are as high as those of the conventional DMOS.

Now, as illustrated in FIG. 21, the gate electrode 9 is formed by depositing a polysilicon film on the main surface of the wafer 21 to a thickness of approximately 400 nm and patterning the polysilicon film so as to be separated by a distance of c which is shorter by $2\beta$ than the distance b between the two U-grooves 50 adjacent to each other. Then, the gate oxide film 8 is further oxidized so as to be thicker at the end part of the gate electrode 9. Here, when the length of a part where the gate oxide film 8 is thickened is x as illustrated in FIG. 22, $\beta$ is set to be longer than x ($\beta > x$).

The processes illustrated in FIGS. 10 through 22 are the most important stages of the manufacturing process according to this embodiment, in which the n-type base layer 16, the n⁺-type source layer 4 and the channel 5 are formed by using the LOCOS oxide film 65 as a mask for self-alignment type double diffusion, then the LOCOS oxide film 65 is removed, and then the gate oxide film 8 and the gate electrode 9 are formed.

Next, as illustrated in FIG. 23, boron ions are implanted through an oxide film 67 by using a patterned resist film 68 as a mask to form the p⁺-type base contact layer 17.

Following the above, as illustrated in FIG. 24, the p⁺-type base contact layer 17 is formed to a thickness of approximately 0.5 μm by thermal diffusion.

Then, as illustrated in FIG. 1(b), the interlayer insulating film 18 is formed with a BPSG on the main surface of the wafer 21, and contact holes are made in parts of the interlayer insulating film 18 to expose the p⁺-type base contact layer 17 and the n⁺-type source layer 4. Furthermore, the source electrode 19 is formed with an aluminum film, and ohmic contact is made between the source electrode 19 and the p⁺-type base contact layer 17 and n⁺-type source layer 4 through the contact hole. Subsequently, a passivation film (not illustrated) is formed with silicon nitride, etc. for protecting the aluminum film by the CVD (chemical vapor deposition) technique or the like. On the back surface of the wafer 21 is formed the drain electrode 20 with three layers of a Ti film, a Ni film and a Au film, an ohmic contact is made between the drain electrode 20 and the n⁺-type semiconductor substrate 1.

According to this embodiment of the present invention, the channel region is formed during the etching process to be deeper than the curve part survived on the groove side surface through the selective oxidation. This flattens the channel region in which electrons flow through the very thin inversion layer, whereby disturbance to the flow of electrons due to the influence of the curve part can be prevented and a low ion voltage can be obtained.

In the above embodiment, the lattice-like pattern was used for describing the present invention. The present invention, however, is not limited to the lattice-like pattern, but may be applied to, for example, a stripe-like pattern as well and the same effect as the lattice-like pattern can be obtained. Furthermore, the present invention is not limited to the vertical type MOSFET, but may be applied to other gate construction such as a power MOSIC with an incorporation of the MOSFET referred to in the above and an IGBT (insulated gate bipolar transistor). In addition, in the above embodiment, description was given to only the n-type channel, but needless to say, the present invention can obtain the same effect as the n-type channel by a p-type channel in which the semiconductor type (n type) is replaced with p type.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A manufacturing method of a semiconductor device comprising:

an etching process for forming a groove by etching a specified region of a surface of a first conductivity type semiconductor layer as a main surface, wherein the semiconductor layer is located on a surface of a semiconductor substrate and has an impurity concentration lower than that of the semiconductor substrate;

a selective oxidation process for forming a selective oxide film to a specified thickness from the main surface within the semiconductor layer within the specified region by selectively oxidizing a region including an inside surface of the groove formed by the etching process;

an impurity introduction process for forming a channel on a part deeper than a curve part located on an inlet part of the groove by diffusing second conductivity type and first conductivity type impurities from the main surface to form the channel on the surface of the semiconductor layer being in contact with a side surface of the selective oxide film and concurrently turning the semiconductor layer to be a first conductivity type drain layer by forming a second conductivity type base layer and a first conductivity type source layer;

a gate formation process for forming a gate electrode on a gate oxide film by forming a groove to a specified depth by removing the selective oxide film and making the gate oxide film by oxidizing an inside wall of the groove including the part on which the channel is formed; and a source and drain electrode formation process for forming a source electrode which is to electrically contact both the source layer and the base layer, and for forming a drain electrode which is to electrically contact another surface of the semiconductor substrate.

2. The manufacturing method for a semiconductor device according to claim 1, wherein the impurity introduction process comprises a process in which the second conductivity type and first conductivity type impurities are doubly diffused from the main surface in a successive manner in self-alignment with the selective oxide film to form the channel on the surface of the semiconductor layer being in contact with a side surface of the selective oxide film and the channel is formed by the double diffusion on the part deeper than the curve part located on the inlet part of the groove and concurrently the semiconductor layer is turned to be the first conductivity type drain layer by forming the second conductivity type base layer and the first conductivity type source layer.

3. A manufacturing method for a semiconductor device comprising:

a mask formation process for forming a mask having an opening part within a specified region on a main surface of a first conductivity type semiconductor substrate;

an etching process for forming a first groove having an inlet part wider than the opening part on the semiconductor substrate by etching the semiconductor substrate through the opening part of the mask;

a selective oxidation process for forming a selective oxide film to a specified thickness on a surface of the first groove and between the mask and the semiconductor substrate by selectively oxidizing a region including the first groove and concurrently forming a curve part on a boundary surface of the semiconductor substrate with the selective oxide film;

an impurity introduction process for forming a base layer by diffusing second conductivity type impurities from the main surface so as to include a surface of the semiconductor substrate being in contact with a side surface of the selective oxide film and for forming a first conductivity type source layer by diffusing first conductivity type impurities from the main surface within the base layer to a region deeper than the curve part so as to form a channel region in the region deeper than the curve part within the base layer of the first groove;

a selective oxide film removal process for forming a second groove to a specified depth deeper than the first groove by removing the selective oxide film; and an electrode formation process for forming a source electrode which is to electrically contact both the source layer and the base layer by forming a gate electrode through a gate oxide film on a surface of the second groove and for forming a drain electrode which is to electrically contact other main surface of the semiconductor substrate.

4. The manufacturing method for a semiconductor device according to claim 3, wherein:

the etching process comprises a process in which the semiconductor substrate is etched through the opening part of the mask and thereby the first groove having an inlet part wider than the opening part, a bottom surface and a side surface connecting the inlet part and the bottom surface on the semiconductor substrate;

the selective oxidation process comprises a process in which the selective oxide film is formed to a specified thickness on the inlet part, bottom surface and side surface of the first groove and between the mask and the semiconductor substrate by selectively oxidizing a region including the first groove and concurrently the curve part is formed on the boundary surface of the semiconductor substrate with the selective oxide film; and the impurity introduction process comprises a process in which the base layer is formed by diffusing the second conductivity type impurities from the main surface so as to include the semiconductor substrate surface being in contact with the side surface of the selective oxide film and a process in which the first conductivity source layer is formed by diffusing the first conductivity type impurities within the base layer so as to form the channel region on the side surface of the first groove instead of the inlet part within the base layer.

5. The manufacturing method for a semiconductor device according to claim 3, wherein the selective oxidation process comprises a process in which the first part of the selective oxide film is formed to a specified thickness on the surface of the first groove by selectively oxidizing a region including the first groove formed by the etching process, the curve part is formed on a part corresponding to the inlet part of the semiconductor substrate, and the second part of the selective oxide film is formed between the mask and the semiconductor substrate in such a way that a thickness of the second part of the selective oxide film decreases in inverse proportion to the distance thereof from the curve part.

6. The manufacturing method for a semiconductor device according to claim 3, wherein the electrode formation process comprises:

a gate formation process for forming a gate oxide film by oxidizing an inside wall of the groove and forming a gate electrode on the gate oxide film; and a source and drain electrode formation process for forming a source electrode which is to electrically contact both the source layer and the base layer, and for forming a drain electrode which is to electrically contact other main surface of the semiconductor substrate.

7. The manufacturing method for a semiconductor device according to claim 3, wherein the impurity introduction process comprises a process in which the base layer is formed on the surface of the first groove by diffusing the second conductivity impurities from the main surface in self-alignment with the selective oxide film and the source layer is formed by diffusing the first conductivity impurities from the main surface within the base layer in self-alignment with the selective oxide film.

* * * * *